(12) United States Patent
McCrea et al.

(10) Patent No.: US 9,335,352 B2
(45) Date of Patent: May 10, 2016

(54) BRANCH CIRCUIT MONITOR POWER MEASUREMENT

(75) Inventors: Benjamin J. McCrea, San Francisco, CA (US); Matthew Rupert, Amity, OR (US); Michael Bitsch, Hillsboro, OR (US)

(73) Assignee: Veris Industries, LLC, Tualatin, OR (US)

(*) Notice: Subject to any disclaimer, the term of this patent is extended or adjusted under 35 U.S.C. 154(b) by 1531 days.

(21) Appl. No.: 12/660,845

(22) Filed: Mar. 4, 2010

(65) Prior Publication Data

US 2010/0235122 A1 Sep. 16, 2010

Related U.S. Application Data

(60) Provisional application No. 61/210,119, filed on Mar. 13, 2009.

(51) Int. Cl.
*G01R 19/00* (2006.01)
*G01R 13/00* (2006.01)
*G01R 21/06* (2006.01)
*G01R 21/133* (2006.01)

(52) U.S. Cl.
CPC .............. *G01R 21/06* (2013.01); *G01R 21/133* (2013.01)

(58) Field of Classification Search
CPC .............................. G01R 21/06; G01R 21/133
USPC .......................................................... 702/64
See application file for complete search history.

(56) References Cited

U.S. PATENT DOCUMENTS

| | | |
|---|---|---|
| 1,100,171 A | 6/1914 | Brown |
| 1,455,263 A | 5/1923 | Oberfell |
| 1,569,723 A | 1/1926 | Dickinson |
| 1,800,474 A | 4/1931 | Scherer |
| 1,830,541 A | 11/1931 | Harris |
| 1,871,710 A | 8/1932 | Lenehan |
| 2,059,594 A | 11/1936 | Massa, Jr. |
| 2,412,782 A | 12/1946 | Palmer |
| 2,428,613 A | 10/1947 | Boyajian |
| 2,663,190 A | 12/1953 | Ilgenfritz |
| 2,746,295 A | 5/1956 | Lubkin |
| 2,802,182 A | 8/1957 | Godshalk et al. |
| 2,852,739 A | 9/1958 | Hansen |
| 2,943,488 A | 7/1960 | Strobel et al. |
| 3,190,122 A | 6/1965 | Edwards |

(Continued)

FOREIGN PATENT DOCUMENTS

| | | | |
|---|---|---|---|
| EP | 1531334 A2 * | 5/2005 | |
| JP | 5083776 | 4/1993 | |

OTHER PUBLICATIONS

AT91M42800A Summary, "AT91 ARM Thumb Microcontrollers," Atmel, Feb. 2002.

(Continued)

*Primary Examiner* — Timothy Thompson
*Assistant Examiner* — Rhadames J Alonzo Miller
(74) *Attorney, Agent, or Firm* — Chernoff Vilhauer McClung & Stenzel, LLP

(57) ABSTRACT

In a digital branch circuit monitor, compensation for the phase error is accomplished by selecting a voltage sampled at a time temporally offset from the sampling time of the current by an interval quantifying the phase shift of the secondary current relative to the primary current that is characteristic of a current transformer.

20 Claims, 5 Drawing Sheets

(56) References Cited

U.S. PATENT DOCUMENTS

| | | | |
|---|---|---|---|
| 3,243,674 A | 3/1966 | Ebert | |
| 3,287,974 A | 11/1966 | Ciemochowski | |
| 3,374,434 A | 3/1968 | Perry | |
| 3,493,760 A | 2/1970 | Hoadley | |
| 3,512,045 A | 5/1970 | Sanger et al. | |
| 3,584,294 A | 6/1971 | Siwko | |
| 3,593,078 A | 7/1971 | Dornshy et al. | |
| 3,696,288 A | 10/1972 | Carman | |
| 3,728,705 A | 4/1973 | Atkins | |
| 3,769,548 A | 10/1973 | Pardue | |
| 3,772,625 A | 11/1973 | Raupach | |
| 3,861,411 A | 1/1975 | Mitchell et al. | |
| 3,955,701 A | 5/1976 | Fisch | |
| 4,001,647 A | 1/1977 | Klein et al. | |
| 4,001,758 A | 1/1977 | Esper et al. | |
| 4,030,058 A | 6/1977 | Riffe et al. | |
| 4,048,605 A | 9/1977 | McCollum | |
| 4,096,436 A | 6/1978 | Cook et al. | |
| 4,107,519 A | 8/1978 | Bicek | |
| D249,883 S | 10/1978 | Collins | |
| 4,151,578 A | 4/1979 | Bell | |
| 4,158,217 A | 6/1979 | Bell | |
| 4,158,810 A | 6/1979 | Leskovar | |
| 4,177,496 A | 12/1979 | Bell et al. | |
| 4,198,595 A | 4/1980 | Milkovic | |
| 4,207,604 A | 6/1980 | Bell | |
| 4,215,278 A | 7/1980 | Barbier et al. | |
| 4,227,419 A | 10/1980 | Park | |
| 4,241,237 A | 12/1980 | Paraskevakos et al. | |
| 4,249,264 A | 2/1981 | Crochet et al. | |
| 4,250,449 A | 2/1981 | Shum | |
| 4,253,336 A | 3/1981 | Pietzuch | |
| 4,258,348 A | 3/1981 | Belfer et al. | |
| 4,297,741 A | 10/1981 | Howell | |
| 4,328,903 A | 5/1982 | Baars | |
| 4,354,155 A | 10/1982 | Speidel et al. | |
| 4,359,672 A | 11/1982 | Hart | |
| 4,362,580 A | 12/1982 | Kane et al. | |
| 4,363,061 A | 12/1982 | Vaerewyck et al. | |
| 4,371,814 A | 2/1983 | Hannas | |
| 4,373,392 A | 2/1983 | Nagamoto | |
| 4,384,289 A | 5/1983 | Stillwell et al. | |
| 4,386,280 A | 5/1983 | Ricaud et al. | |
| 4,388,668 A | 6/1983 | Bell et al. | |
| 4,393,714 A | 7/1983 | Schmidt | |
| 4,398,426 A | 8/1983 | Park et al. | |
| 4,408,175 A | 10/1983 | Nelson et al. | |
| 4,413,193 A | 11/1983 | Crockett | |
| 4,413,230 A | 11/1983 | Miller | |
| 4,426,673 A | 1/1984 | Bell et al. | |
| 4,432,238 A | 2/1984 | Tward | |
| 4,491,790 A | 1/1985 | Miller | |
| 4,492,919 A | 1/1985 | Milkovic | |
| 4,495,463 A | 1/1985 | Milkovic | |
| 4,506,199 A | 3/1985 | Asche | |
| 4,558,310 A | 12/1985 | McAllise | |
| 4,558,595 A | 12/1985 | Kompelien | |
| 4,574,266 A | 3/1986 | Valentine | |
| 4,605,883 A | 8/1986 | Cockroft | |
| 4,621,532 A | 11/1986 | Takagi et al. | |
| 4,660,407 A | 4/1987 | Takami et al. | |
| 4,667,198 A * | 5/1987 | Suzuki | 324/142 |
| 4,709,339 A | 11/1987 | Fernandes | |
| 4,739,229 A | 4/1988 | Heiler, Jr. | |
| 4,746,809 A | 5/1988 | Coleman et al. | |
| 4,754,365 A | 6/1988 | Kazahaya | |
| 4,757,416 A | 7/1988 | Wilkerson | |
| 4,758,774 A | 7/1988 | Crawford et al. | |
| 4,758,962 A | 7/1988 | Fernandes | |
| 4,783,748 A | 11/1988 | Swarztrauber et al. | |
| 4,794,327 A | 12/1988 | Fernandes | |
| 4,808,910 A | 2/1989 | Kessi | |
| D301,331 S | 5/1989 | Rhodin | |
| 4,851,803 A | 7/1989 | Hahn | |
| 4,855,671 A | 8/1989 | Fernandes | |
| 4,874,904 A | 10/1989 | DeSanti | |
| 4,890,318 A | 12/1989 | Crane et al. | |
| 4,926,105 A | 5/1990 | Mischenko et al. | |
| 4,939,451 A | 7/1990 | Baran et al. | |
| 4,944,187 A | 7/1990 | Frick et al. | |
| 4,956,588 A | 9/1990 | Ming | |
| 4,970,476 A | 11/1990 | Kitagawa | |
| 4,972,167 A | 11/1990 | Fujioka | |
| 4,992,709 A | 2/1991 | Griffin | |
| 4,999,575 A | 3/1991 | Germer | |
| 5,003,278 A | 3/1991 | May | |
| 5,006,846 A | 4/1991 | Granville | |
| 5,014,908 A | 5/1991 | Cox | |
| 5,017,860 A * | 5/1991 | Germer et al. | 324/142 |
| 5,039,970 A | 8/1991 | Cox | |
| 5,051,601 A | 9/1991 | Atobe et al. | |
| 5,066,904 A | 11/1991 | Bullock | |
| 5,079,510 A | 1/1992 | Komatsu et al. | |
| D323,815 S | 2/1992 | Boutellier | |
| 5,099,193 A | 3/1992 | Moseley et al. | |
| 5,122,735 A | 6/1992 | Porter et al. | |
| 5,148,348 A | 9/1992 | White | |
| 5,181,026 A | 1/1993 | Granville | |
| 5,196,784 A | 3/1993 | Estes, Jr. | |
| D335,488 S | 5/1993 | Suzuki et al. | |
| 5,223,790 A | 6/1993 | Baran et al. | |
| 5,267,122 A | 11/1993 | Glover et al. | |
| 5,296,819 A | 3/1994 | Kuroiwa et al. | |
| 5,311,138 A | 5/1994 | Ott et al. | |
| 5,317,274 A | 5/1994 | Nakagawa et al. | |
| 5,323,256 A | 6/1994 | Banks | |
| 5,337,206 A | 8/1994 | Kadah et al. | |
| 5,365,462 A | 11/1994 | McBean | |
| 5,377,128 A | 12/1994 | McBean | |
| D354,945 S | 1/1995 | Dellavecchia et al. | |
| 5,385,060 A | 1/1995 | Wang | |
| 5,391,983 A | 2/1995 | Lusignan et al. | |
| 5,397,970 A | 3/1995 | Rowlette et al. | |
| 5,410,920 A | 5/1995 | Westwick | |
| 5,426,360 A | 6/1995 | Maraio et al. | |
| 5,430,438 A | 7/1995 | Joos et al. | |
| 5,444,183 A | 8/1995 | Gehrs et al. | |
| 5,450,765 A | 9/1995 | Stover | |
| 5,467,012 A | 11/1995 | Nystrom | |
| 5,471,359 A | 11/1995 | Simpson et al. | |
| 5,473,234 A | 12/1995 | Richardson | |
| 5,548,209 A | 8/1996 | Lusignan et al. | |
| 5,563,506 A | 10/1996 | Fielden et al. | |
| 5,572,073 A | 11/1996 | Burgess et al. | |
| 5,578,927 A | 11/1996 | Perelle | |
| 5,592,989 A | 1/1997 | Lynn et al. | |
| 5,596,652 A | 1/1997 | Piatek et al. | |
| 5,604,315 A | 2/1997 | Briefer et al. | |
| 5,612,499 A | 3/1997 | Andrew et al. | |
| 5,677,476 A | 10/1997 | McCarthy et al. | |
| 5,705,989 A | 1/1998 | Cota et al. | |
| 5,712,558 A | 1/1998 | Saint-Cyr et al. | |
| 5,736,847 A * | 4/1998 | Van Doorn et al. | 324/142 |
| 5,753,983 A | 5/1998 | Dickie et al. | |
| 5,784,249 A | 7/1998 | Pouliot | |
| 5,808,846 A | 9/1998 | Holce et al. | |
| 5,844,138 A | 12/1998 | Cota | |
| 5,861,683 A | 1/1999 | Engel et al. | |
| 5,880,677 A | 3/1999 | Lestician | |
| 5,880,918 A | 3/1999 | Horbelt et al. | |
| 5,905,439 A | 5/1999 | Mcintyre | |
| 5,909,087 A | 6/1999 | Bryde et al. | |
| 5,920,190 A | 7/1999 | Peterson et al. | |
| 5,920,191 A | 7/1999 | Maniero et al. | |
| 5,922,939 A | 7/1999 | Cota | |
| 5,994,892 A | 11/1999 | Turino et al. | |
| 5,995,911 A | 11/1999 | Hart | |
| D419,964 S | 2/2000 | Holce et al. | |
| 6,020,702 A | 2/2000 | Farr | |
| 6,029,524 A | 2/2000 | Klauder et al. | |
| 6,044,430 A | 3/2000 | MacDonald | |
| 6,046,550 A | 4/2000 | Ference et al. | |
| 6,064,192 A | 5/2000 | Redmyer | |
| 6,091,023 A | 7/2000 | O'Donnell | |

(56) References Cited

U.S. PATENT DOCUMENTS

| | | | |
|---|---|---|---|
| 6,112,159 A * | 8/2000 | Bond et al. ............... | 702/61 |
| 6,122,972 A | 9/2000 | Crider | |
| 6,124,791 A | 9/2000 | Wolf | |
| D431,534 S | 10/2000 | Holce et al. | |
| 6,133,709 A | 10/2000 | Puchianu | |
| 6,133,723 A | 10/2000 | Feight | |
| 6,137,418 A | 10/2000 | Zuercher et al. | |
| 6,146,109 A | 11/2000 | Davis et al. | |
| 6,236,949 B1 | 5/2001 | Hart | |
| 6,269,317 B1 | 7/2001 | Schachner et al. | |
| 6,304,202 B1 * | 10/2001 | Pastorello et al. ........... | 341/155 |
| 6,308,140 B1 | 10/2001 | Dowling et al. | |
| 6,330,516 B1 | 12/2001 | Kammeter | |
| 6,331,821 B1 | 12/2001 | Holce et al. | |
| 6,344,951 B1 | 2/2002 | Sato et al. | |
| 6,351,206 B1 | 2/2002 | Schweiger et al. | |
| 6,373,238 B2 | 4/2002 | Lewis et al. | |
| 6,377,430 B2 | 4/2002 | Holce et al. | |
| 6,380,696 B1 | 4/2002 | Sembhi et al. | |
| 6,384,946 B1 | 5/2002 | Pitsch et al. | |
| 6,404,166 B1 | 6/2002 | Puchianu | |
| 6,414,241 B1 | 7/2002 | O'Donnell | |
| 6,429,637 B1 * | 8/2002 | Gandhi ........................ | 324/74 |
| D466,078 S | 11/2002 | Bowman | |
| 6,496,378 B2 | 12/2002 | Holce et al. | |
| 6,504,357 B1 | 1/2003 | Hemminger et al. | |
| 6,504,695 B1 | 1/2003 | Holce et al. | |
| 6,549,859 B1 | 4/2003 | Ward | |
| 6,591,482 B1 | 7/2003 | Fleege et al. | |
| D478,313 S | 8/2003 | Bowman | |
| 6,615,147 B1 | 9/2003 | Jonker et al. | |
| 6,636,028 B2 | 10/2003 | Lavoie et al. | |
| 6,657,424 B1 | 12/2003 | Voisine et al. | |
| 6,737,854 B2 | 5/2004 | Bruno et al. | |
| 6,756,776 B2 | 6/2004 | Perkinson et al. | |
| 6,759,837 B2 * | 7/2004 | Gandhi ........................ | 324/74 |
| 6,774,803 B1 | 8/2004 | Tiffin | |
| 6,809,509 B2 | 10/2004 | Bruno et al. | |
| 6,815,942 B2 | 11/2004 | Randall et al. | |
| 6,825,771 B2 | 11/2004 | Bruno et al. | |
| 6,856,515 B2 | 2/2005 | Holce et al. | |
| 6,861,683 B2 | 3/2005 | Rissing et al. | |
| 6,871,827 B2 | 3/2005 | Petak et al. | |
| 6,888,712 B2 | 5/2005 | Holce et al. | |
| 6,889,271 B1 | 5/2005 | Germer et al. | |
| 6,937,003 B2 | 8/2005 | Bowman et al. | |
| 6,950,292 B2 | 9/2005 | Holce et al. | |
| 6,975,951 B1 * | 12/2005 | Sutrave et al. ................ | 702/106 |
| 6,988,043 B1 | 1/2006 | Randall | |
| 7,006,934 B2 | 2/2006 | Jonker et al. | |
| 7,053,497 B2 | 5/2006 | Sodemann et al. | |
| 7,157,899 B2 | 1/2007 | Bruno | |
| 7,161,345 B2 | 1/2007 | Bruno | |
| 7,193,428 B2 | 3/2007 | Baron et al. | |
| 7,212,930 B2 | 5/2007 | Bruno | |
| 7,221,145 B2 | 5/2007 | Bowman et al. | |
| 7,230,414 B2 | 6/2007 | Bruno | |
| 7,239,810 B2 | 7/2007 | Seely et al. | |
| 7,274,187 B2 | 9/2007 | Loy | |
| 7,282,889 B2 | 10/2007 | Freed et al. | |
| 7,305,310 B2 * | 12/2007 | Slota et al. ................... | 702/57 |
| 7,310,049 B2 | 12/2007 | Bowman | |
| 7,312,686 B2 | 12/2007 | Bruno | |
| 7,330,022 B2 | 2/2008 | Bowman et al. | |
| 7,333,345 B2 | 2/2008 | Holce et al. | |
| 7,352,287 B2 | 4/2008 | Rupert | |
| 7,359,809 B2 | 4/2008 | Bruno | |
| 7,447,603 B2 * | 11/2008 | Bruno ........................... | 702/64 |
| 7,660,682 B2 * | 2/2010 | Slota et al. ................... | 702/57 |
| 2004/0227503 A1 | 11/2004 | Bowman et al. | |
| 2005/0240362 A1 | 10/2005 | Randall | |
| 2006/0085144 A1 | 4/2006 | Slota et al. | |
| 2006/0103548 A1 | 5/2006 | Borkowski et al. | |
| 2006/0129339 A1 * | 6/2006 | Bruno ........................... | 702/60 |
| 2006/0164096 A1 | 7/2006 | Kwon | |
| 2006/0181242 A1 | 8/2006 | Freed et al. | |
| 2006/0212238 A1 * | 9/2006 | Nisenblat et al. ............. | 702/66 |
| 2008/0125986 A1 * | 5/2008 | Slota et al. ................... | 702/61 |
| 2009/0115400 A1 | 5/2009 | Hunter | |
| 2009/0115620 A1 | 5/2009 | Hunter et al. | |
| 2009/0295370 A1 | 12/2009 | Parker et al. | |

OTHER PUBLICATIONS

Ganssie, "Interrupt Latency," Oct. 1, 2001, [online], [retrieved on Aug. 26, 2004], Retrieved from the Embedded.com website using the Internet, <URL: http://www.embedded.com/show/Article.jhtml?articleID=9900320 >.

* cited by examiner

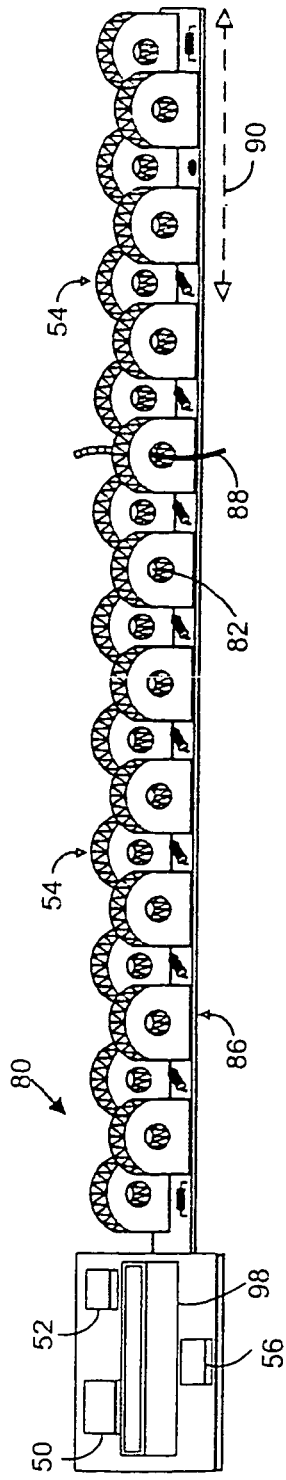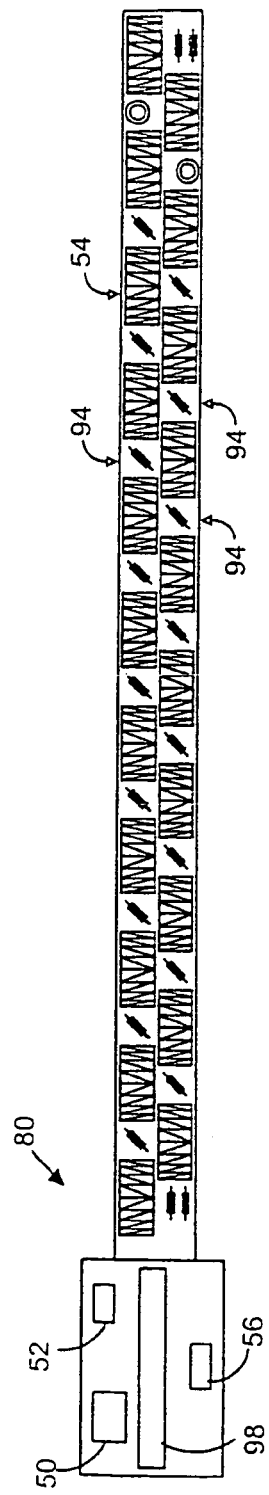
FIG. 5
FIG. 6

BRANCH CIRCUIT MONITOR POWER MEASUREMENT

CROSS-REFERENCE TO RELATED APPLICATIONS

This application claims the benefit of Provisional App. No. 61/210,119, filed Mar. 13, 2009.

BACKGROUND OF THE INVENTION

The present invention relates to a branch circuit monitor and, more particularly, to a method of compensating for phase error when making a power measurement with a branch circuit monitor.

The total power consumption of a building or other facility is monitored by the electric utility with a power meter located between the utility's distribution transformer and the facility's power distribution panel. However, in many instances it is desirable to sub-meter or attribute the facility's power usage and cost to different occupancies, buildings, departments, or cost centers within the facility or to monitor the power consumption of individual loads or groups of loads, such as motors, lighting, heating units, cooling units, machinery, etc. These single phase or multi-phase electrical loads are typically connected to one or more of the branch circuits that extend from the facility's power distribution panel. While a power meter may be installed at any location between a load and the distribution panel, it is often advantageous to install a power meter capable of monitoring a plurality of circuits proximate the power distribution panel to provide centralized monitoring of the various loads powered from the panel.

Flexibility has favored adoption of digital branch circuit monitors incorporating data processing systems that can monitor a plurality of circuits and determine a number of parameters related to electricity consumption. A branch circuit monitor for measuring electricity consumption by respective branch circuits comprises a plurality of voltage and current transducers that are periodically read by the monitor's data processing unit which, in a typical branch circuit monitor, comprises one or more microprocessors or digital signal processors (DSP). The data processing unit periodically reads and stores the outputs of the transducers quantifying the magnitudes of current and voltage samples and, using that data, calculates the current, voltage, power, and other electrical parameters, such as active power, apparent power and reactive power that quantify the distribution and consumption of electricity. The calculated parameters are typically output to a display for immediate viewing or transmitted from the meter's communications interface to another data processing system, such as a building management computer for remote display or further processing, for example formulating instructions to automated building equipment.

The voltage transducers of digital branch circuit monitors commonly comprise a voltage divider network that is connected to a conductor in which the voltage will be measured. The power distribution panel provides a convenient location for connecting the voltage transducers because typically each phase of the electricity is delivered to the power distribution panel on a separate bus bar and the voltage and phase is the same for all loads attached to the respective bus bar. Interconnection of a voltage transducer and the facility's wiring is facilitated by wiring connections in the power distribution panel, however, the voltage transducer(s) can be interconnected anywhere in the wiring that connects the supply and a load, including at the load's terminals.

The current transducers of digital power meters typically comprise current transformers that encircle each of the power cables that connect each branch circuit to the bus bar(s) of the distribution panel. Bowman et al., U.S. Pat. No. 6,937,003 B2, discloses a branch circuit monitoring system that includes a plurality of current transformers mounted on a common support facilitating installation of a branch circuit monitor in an electrical distribution panel. For example, a branch circuit monitor produced by Veris Industries, LLC. commonly includes 84 current sensors; 21 current transformers mounted on each of four supports.

A current transformer typically comprises multiple turns of wire wrapped around the cross-section of a toroidal core. The power cable conducting the load current is passed through the aperture in the center of the toroidal core and constitutes the primary winding of the transformer and the wire wrapped around the cross-section of the core comprises the secondary winding of the transformer. Current flowing in the primary winding (primary current) induces a secondary voltage and current in the secondary winding which is quantitatively related to the current in the primary winding. The secondary winding is typically connected to a resistor network and the magnitude of the primary current can be determined from the amplitude of the voltage at the output of the resistor network. Since the primary winding comprises a single turn, the secondary current is, ideally, precisely equal to the load current in the primary winding divided by the number of turns in the secondary winding, that is:

$$I_1 = I_2(n) \quad (1)$$

where n=number of turns in the secondary winding.

However, actual transformers are not ideal transformers and the magnetization of the core of the current transformer produces errors that reduce the accuracy of the readings produced by the meter. Part of the current in the primary winding is used to magnetize the transformer core with the result that the secondary current is less than the product of the primary current and the ratio of turns in the primary and secondary windings (turns ratio). Referring to FIG. 1, the ratio error ($r_e$) varies with the magnitude of the primary current ($I_1$) as follows:

$$r_e(\%) = K_3 + K_4(\log I_1) \quad (2)$$

where $K_3$ and $K_4$ are constants.

The effect of the ratio error is to alter the relationship between the magnitudes of the measured secondary current ($I_2$) and the primary current ($I_1$) from the theoretical relationship to the relationship:

$$I_1 = I_2'\left(n + \frac{nr_e}{100}\right) \quad (3)$$

where $I_2'$=measured secondary current

The magnitude of the measured secondary current ($I_2'$) is related to the theoretical secondary current ($I_2$), as follows:

$$I_2 = I_2'\left(1 + \frac{r_e}{100}\right) \quad (4)$$

In addition, the magnetization of the transformer core and windings causes a phase shift between the current in the primary winding and the current in the secondary winding. Since the transformer core is inductive in nature, the phase shift causes the phase of the secondary current to lag the phase of the primary current. Referring to FIG. 2, the resulting phase error ($p_e$) varies with the magnitude of the primary current ($I_1$) approximately according to the relationship:

$$p_e = K_1 + K_2(I_1^{-M}) \quad (5)$$

where M, $K_1$ and $K_2$ are constants

In practice M is often approximately equal to ½ and, consequently, a square root approximation can often be conveniently employed as part of the overall correction algorithm. The values of the constants $K_1$, $K_2$, $K_3$, and $K_4$ depend upon the configuration of the particular current transformer. Factors such as core material and turns ratio affect the values of the constants which are typically ascertained by experiment with samples of a given core configuration. Typically, the values of $K_1$, $K_2$, $K_3$, and $K_4$ are determined for a particular transformer configuration or production batch by comparing the actual performance of a sample of the transformer configuration to the performance of a standard device when the secondary winding is connected in parallel to a particular impedance or burden.

In the typical digital power meter, instantaneous values of the sinusoidal analog voltage and current waveforms are digitally captured by periodically, simultaneously sampling the amplitudes of the outputs of respective voltage and current transducers. The effective power is approximated by averaging the sum of the products of the temporally corresponding instantaneous samples of the load voltage and current for each of the plurality of sampling intervals making up at least one cycle of the sinusoidal waveform:

$$P \cong \frac{1}{T} \sum_{k=1}^{k=\frac{T}{\Delta t}} v(k)i(k)\Delta t \quad (6)$$

where: P=effective power
  v(k)=sample voltage for the k-th sample, for example voltage 24
  i(k)=sample current for the k-th sample, for example current 26
  $\Delta t$=sampling interval Before calculating electrical parameters based on the current, such as real power, total power, reactive power etc., the data processing system typically adjusts the value of the instantaneous load current to compensate for the effects of phase error and ratio error introduced by the current transformer. Typically, an initial or assumed value of the primary or load current is determined from the theoretical relationship of the primary current and the secondary current for an ideal transformer, equation (1), and the instantaneous measured secondary current. Then using the assumed load current, the data processing system accesses one or more ratio and phase error correction factors that are typically stored in a table or an equation in a memory and, using a correction algorithm, applies the correction factors to the assumed load current to calculate the adjusted or actual load current. To obtain accurate results, the phase and ratio error correction factors must be available for all possible values of the instantaneous current in the meter's operating range and the correction factors are commonly stored in the form of a table, a mathematical formula, or another form representing error correction as a function of the instantaneous primary current. Substantial data storage capacity is necessary to store the required data for correcting currents throughout the meter's operating range and substantial processing power is required to apply the appropriate correction factors to each of the instantaneous load currents calculated from the samples of the secondary current.

Bruno, U.S. Pat. No. 7,359,809, incorporated herein by reference, discloses a meter and a method of determining current in which the root mean square (rms) current of a plurality of accumulated current samples is calculated and used to determine the phase error correction for the current sensor. The phase error and the ratio error correction factors are then applied to one or more current samples to determine the corrected magnitudes of the instantaneous current samples. Since the rms current varies much slower than the instantaneous current, the data processing resources of the meter can be significantly reduced.

Bruno, U.S. Pat. No. 7,447,603, incorporated herein by reference, discloses a power meter in which the phase error is determined from the rms current or otherwise and the reading of respective voltage and current sensors are temporally offset by a time differential equivalent to the phase error so that the phase error is accounted for in the instantaneous values of voltage samples that correspond to respective current samples. While temporally offsetting the current and voltage sampling to accommodate phase error significantly reduces the data processing requirements of the meter, the differential between the current sampling and the voltage sampling can make it difficult to sample at a sufficiently high frequency to accommodate the large number of current sensors that characterize a branch circuit monitor and can interfere with obtaining a sufficient number of current samples from each of the sensors during each AC cycle to adequately describe the current waveform to avoid aliasing. In addition, due to the large number of current sensors that characterize a branch circuit monitor, capturing a voltage sample corresponding to each of the current samples produces a substantial number of voltage samples increasing the bandwidth and the cost of the data processing unit of the meter.

What is desired, therefore, is a branch circuit monitor and a method of operating a branch circuit monitor enabling current sampling at a high frequency but requiring a relatively low bandwidth while providing phase error corrected electrical measurements for a substantial number of monitored circuits.

BRIEF DESCRIPTION OF THE DRAWINGS

FIG. 5 is a perspective illustration of a plurality of sensors attached to a common support.

FIG. 6 is a top view of the plurality of sensors of FIG. 5.

DETAILED DESCRIPTION OF PREFERRED EMBODIMENTS

Figure 1:
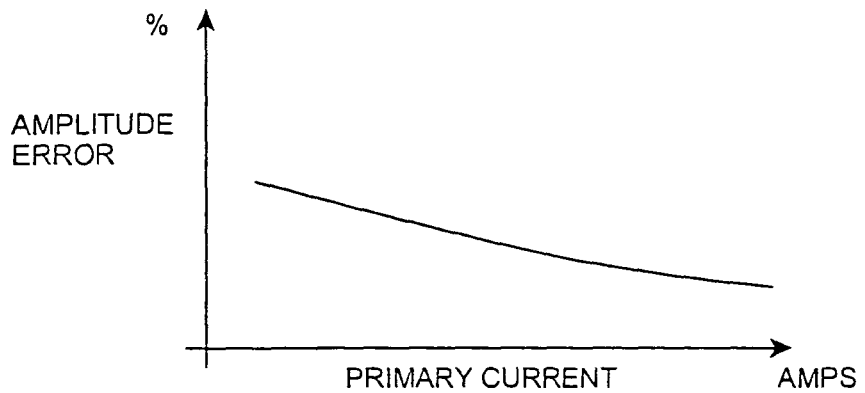
FIG. 1 is a graph of ratio error versus primary current for an exemplary current transformer.
Figure 2:
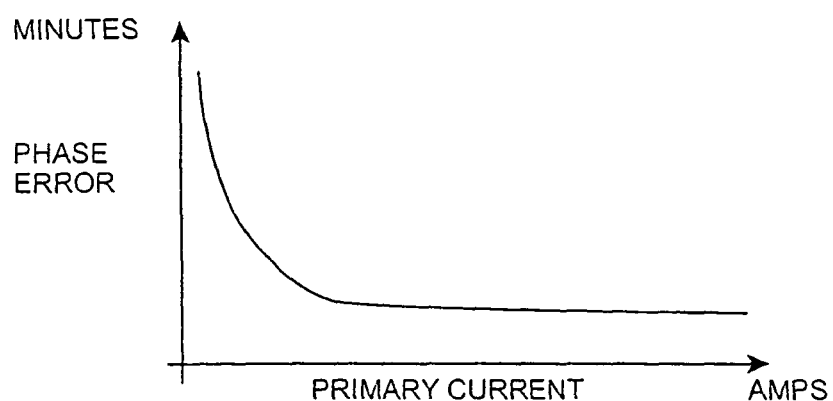
FIG. 2 is a graph of phase error versus primary current for an exemplary current transformer.
Figure 3:
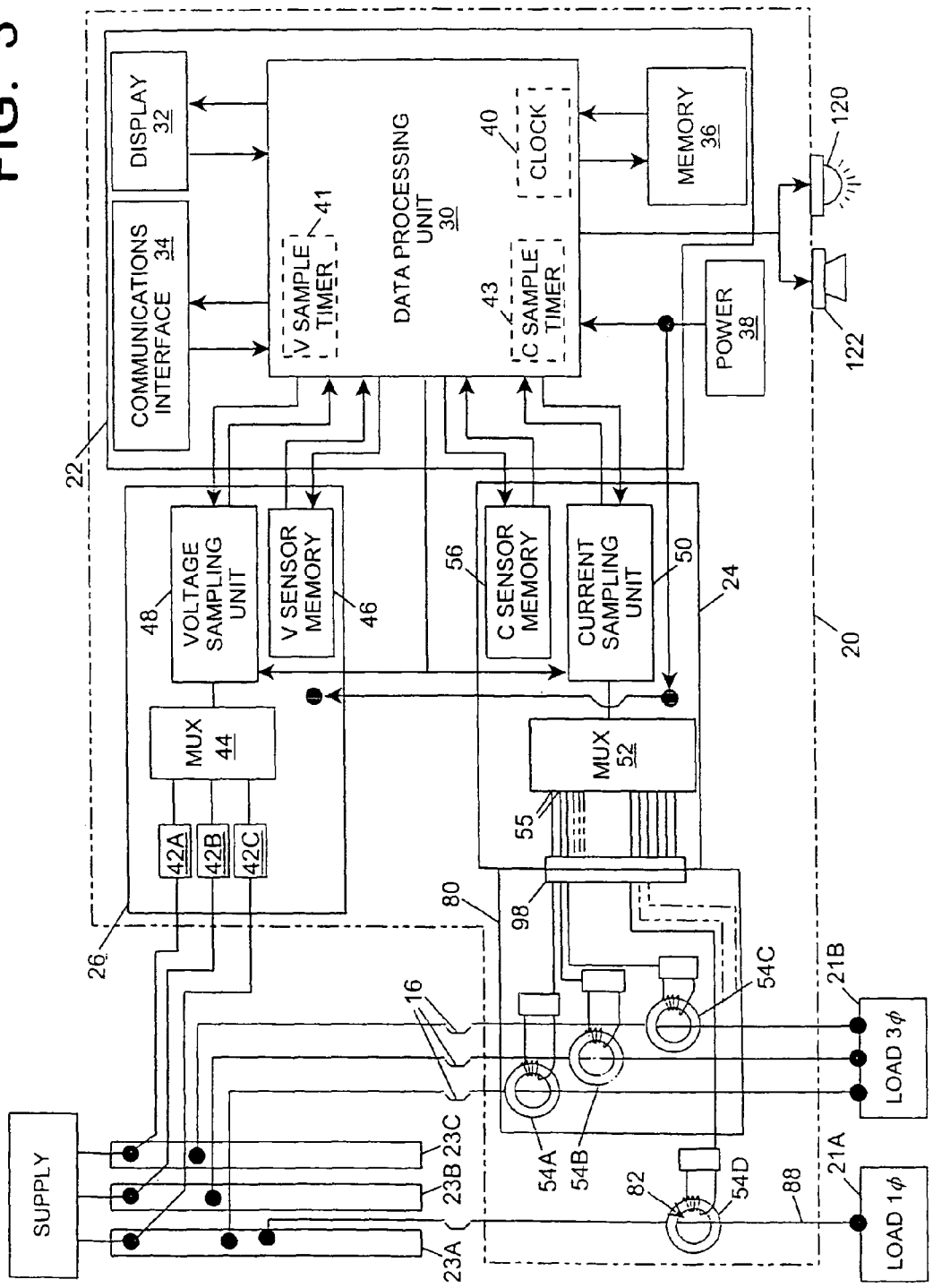
FIG. 3 is a schematic diagram of a branch circuit monitor.

Referring in detail to the drawings where similar parts are identified by like reference numerals, and, more particularly to FIG. 3, a branch circuit monitor 20 arranged to monitor the voltage and current in a plurality of branch circuits comprises, generally, a data processing module 22, a current module 24 and a voltage module 26. The data processing module 22 comprises a data processing unit 30 which, typically, comprises at least one microprocessor or digital signal processor (DSP). The data processing unit 30 reads and stores data received periodically from the voltage module and the current module, and uses that data to calculate the current, voltage, power and other electrical parameters that are the meter's output. The calculated values may be output to a display 32 for viewing at the meter or output to a communications interface 34 for transmission to another data processing system, such as a building management computer, for remote display or use in automating or managing facility functions. The data processing module may also include a memory 36 in which the programming instructions for the data processing unit and the data manipulated by the data processing unit may be stored. In addition, the branch circuit monitor typically includes a power supply 38 to provide power to the data processing unit and to the voltage and current modules.

The voltage module 26 includes one or more voltage transducers 42 each typically comprising a resistor network, a voltage sampling unit 48 to sample the output of the voltage transducers and convert the analog measurements to digital data suitable for use by the data processing unit and a multiplexer 44 that periodically connects the voltage sampling unit to selected ones of the voltage transducers enabling periodic sampling of the magnitude of the voltage at each of the voltage transducers. Typically, each phase of the electricity supplied to a distribution panel is connected to a bus bar 23 to which are connected the circuit breakers 16 that provide a conductive interconnection to each of the respective loads, by way of examples, a single-phase load 21A and a three-phase load 21B. Since the voltage and phase supplied to all commonly connected loads is the same, a meter for measuring three-phase power typically includes three voltage transducers 42A, 42B, 42C each connected to a respective bus bar 23A, 23B, 23C. A clock 40, which may be included in the data processing unit, provides periodic timing signals to trigger sampling of the outputs of the voltage transducers by the voltage sampling unit. The voltage module also includes a voltage sensor memory 46 in which voltage sensor characterization data, including relevant specifications and error correction data for the voltage transducers are stored. If a portion of the voltage module requires replacement, a new voltage module comprising a voltage sensor memory containing sensor characterization data for the transducers of the new module can be connected to the data processing unit. The data processing unit reads the data contained in the voltage sensor memory and applies the sensor characterization data when calculating the voltage from the output data of the replacement voltage module.

The current module 24 typically comprises a current sampling unit 50, a multiplexer 52 and a plurality of current transducers 54 communicatively connected to respective sensor positions 55 of the current module. The multiplexer 52 sequentially connects the sampling unit to the respective sensor positions enabling the sampling unit to periodically sample the output of each of the current transducers 54. The current sampling unit comprises an analog-to-digital converter to convert the analog sample at the output of a current transducer selected by the multiplexer, to a digital signal for acquisition by the data processing unit. The clock 40 also provides the periodic timing signal that triggers sampling of the current transducer outputs by the current sampling unit. The current module also includes a current sensor memory 56 in which are stored characterization data for the current transducers comprising the module. The characterization data may include transducer identities; relevant specifications, such as turns ratio; and error correction factors, for example equation or tables enabling the phase and ratio errors to be related to a current to enable correction for magnetization induced errors. The characterization data may also include the type of transducers, the number of transducers, the arrangement of transducers and the order of the transducers attachment to the respective sensor positions of the current module. At start up, the data processing unit queries the current sensor memory to obtain characterization data including error correction factors and relevant specifications that are used by the data processing unit in determining the meter's output.

Figure 4:
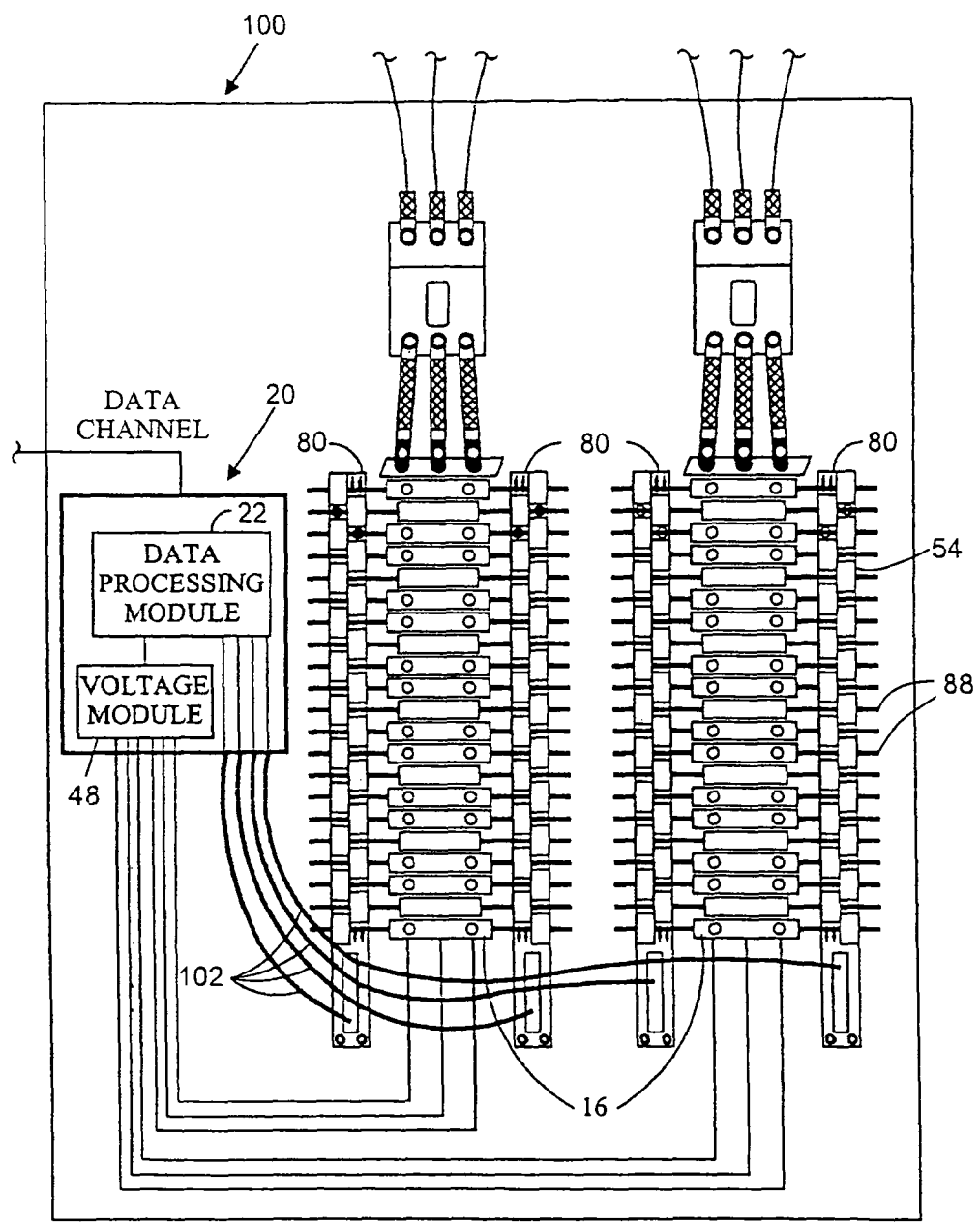
FIG. 4 illustrates an exemplary power distribution panel including circuit breakers, a power meter and associated sensors.

Monitoring current in a plurality of branch circuits typically requires a plurality of current transducers, each one encircling one of the branch power cable(s) 88 that connect the distribution panel to the load(s) of the respective branch circuit. Current sensing may be performed by individual current sensors, such as the current transformer 54D, that are connected to the current module. Referring to FIGS. 4-6, on the other hand, a power meter may comprise one or more sensor strips 80 each comprising a plurality of current sensors attached to a common support, such as sensors 54A, 54B, 54C. The sensors 54 are preferably current transformers but other types of sensors may be used. Each current transformer comprises a coil of wire wound on the cross-section of a toroidal metallic or non-metallic core. The toroidal core is typically enclosed in a plastic housing that includes an aperture 82 enabling a power cable 88 to be extended through the central aperture of the core. The openings 82 defined by the toroidal cores of the transformers are preferably oriented substantially parallel to each other and oriented substantially perpendicular to the longitudinal axis 90 of the support 86. To provide a more compact arrangement of sensors, the sensors 54 may be arranged in substantially parallel rows on the support and the housings of the sensors in adjacent rows may be arranged to partially overlap in the direction of the longitudinal axis of the support. To facilitate routing the power cables of the branch circuits through the cores of the current transformers, the common support maintains the current transformers in a fixed spatial relationship that preferably aligns the apertures of the toroidal coils directly opposite the connections of the power cables 88 and their respective circuit breakers 16 when the strip is installed in a distribution panel 100. For protection from electrical shock, a transient voltage suppressor 94 may be connected in parallel across the output terminals of each sensor to limit the voltage build up at the terminals when the terminals are open circuited.

The transducer strip 80 may include the current sensor memory 56 containing characterization data for the current transformers mounted on the support 86. The current sensor memory may also include characterization data for the transducer strip enabling the data processing unit to determine whether a transducer strip is compatible with the remainder of the meter and whether the strip is properly connected to the data processing module. Improper connection or installation of an incompatible transducer strip may cause illumination of signaling lights or a warning message on the meter's display. In addition. the transducer strip 80 may comprise a current module of the power meter with one or more current transformers 54, the multiplexer 52, the current sampling unit 50 and the current sensor memory all mounted on the support 86. A connector 98 provides a terminus for a communication link 102 connecting the current transducer strip (current module) to the data processing module 22.

The branch circuit monitor may also include one or more errant current alarms to signal an operator or data processing system that manages the facility or one or more of its operations of an errant current flow in one of the monitored branch circuits. When a current having a magnitude greater or lesser than a respective alarm current limit is detected in one of the branch circuits an alarm annunciator is activated to notify the operator or another data processing system of the errant current flow. An alarm condition may be announced in one or more ways, including, without limitation, periodic or steady illumination of a light 120, sounding of an audible alarm 122, display of a message on the meter's display 32 or transmission of a signal from the communications interface 34 to a remote computer or operator.

A branch circuit monitor for monitoring a commercial electrical distribution panel commonly includes a substantial number of current transducers. For example, a branch circuit meter from Veris Industries, LLC. is commonly equipped with 84 current transformers. Simultaneously sampling the corresponding voltage and current and calculating the various electrical parameters output by the meter requires substantial data processing capabilities. Bruno, U.S. Pat. No. 7,447,603 discloses a branch circuit meter in which phase error corrections for the current transformers are determined from the rms current of a plurality of samples and in which the sampling of the current and voltage are temporally offset for phase error correction. Magnetization of the core of a transformer causes a phase shift between the current in the primary winding (the primary current) and the current in the secondary winding (the secondary current). Since the AC voltage and current waveforms are in phase when generated, the phase shift produced by a current transformer causes the phase of the secondary current to shift relative to the voltage as well as the primary current. Temporally offsetting the sampling of the voltage and the secondary current enables compensation for the error produced by the phase shift while reducing data processing. In addition, the data processing requirements are substantially reduced because the rms current changes much more slowly than the instantaneous current. However, the time required to obtain corresponding current and voltage samples is extended by the temporal delay in obtaining both samples which may make it difficult to sample at a sufficiently high rate or frequency to accommodate a large number of current sensors. Moreover, if a substantial number of circuits are monitored, obtaining a voltage sample each time a current sample is obtained produces a large number of voltage samples for each cycle of the AC voltage requiring a data processing unit with substantial bandwidth to transfer the sample data and calculate the various electrical parameters output by the meter. The current inventors realized that more data than was necessary to satisfactorily describe the AC voltage waveform was obtained by sampling the respective voltage each time the current in one of the multiple branches was sampled. The inventors concluded that the bandwidth of a branch circuit monitor's data processing unit could be substantially reduced if temporally offset, non-corresponding voltage and current samples were utilized in compensating for the phase error produced by the current transducer(s). In correspondence of voltage and current sampling and temporally independent sampling times would enable selecting sampling rates that would optimize the quantities of data collected to describe the respective voltage and current waveforms in a large number of branch circuits.

Figure 7:
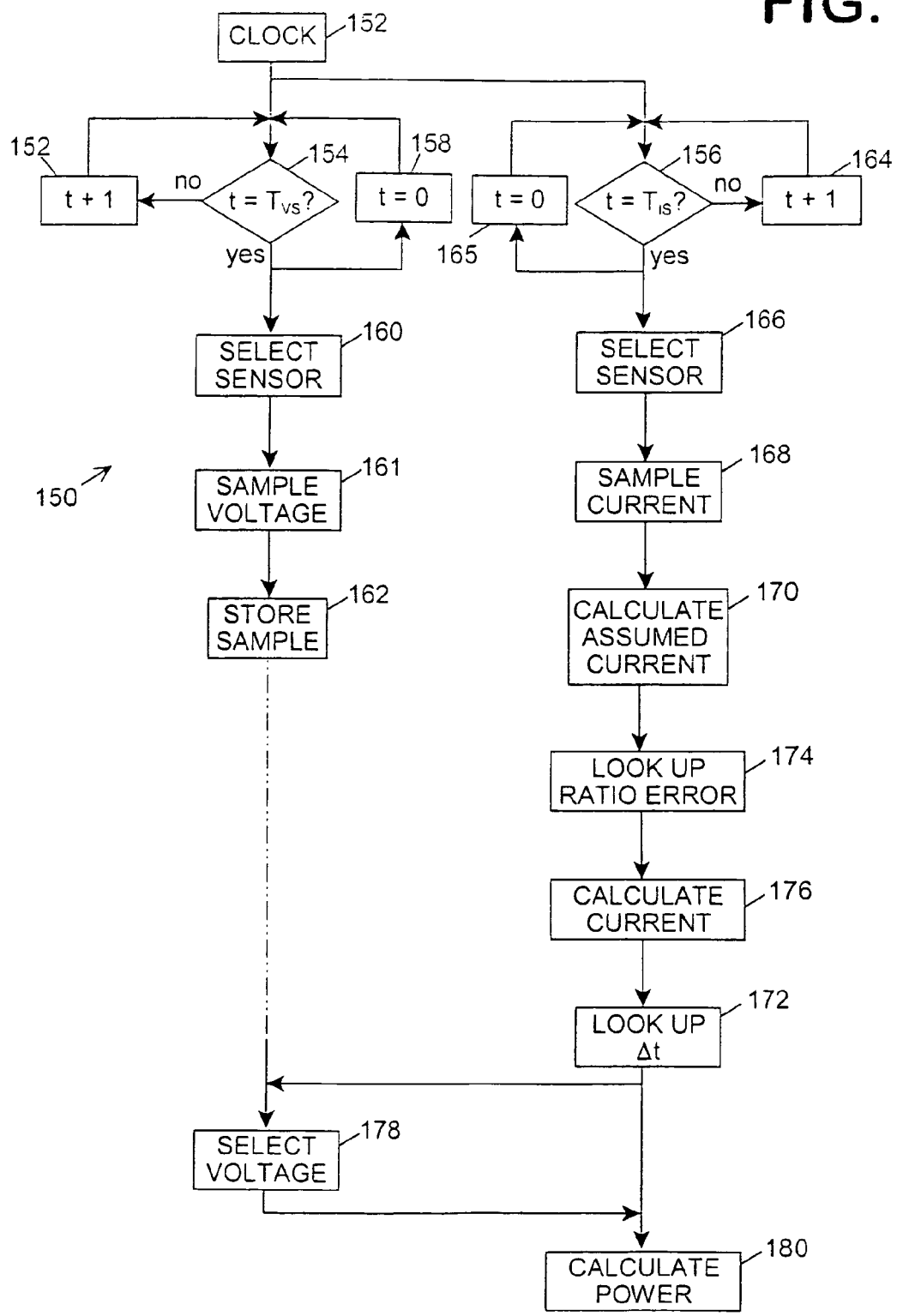
FIG. 7 is flow diagram of a method of monitoring current and voltage and calculating electric power.

Referring also to FIG. 7, to reduce the required bandwidth and data processing requirements the branch circuit monitor 20 employs a sampling and power measurement method 150 which utilizes voltage and current samples that are obtained at temporally independent sampling times. The clock 40 transmits timing signals 152 to a voltage sampling timer 41 and a current sampling timer 43. The voltage and current sampling timers are illustrated as separate devices but may be a single device or a timing signal counter created in the data processing unit. The voltage sampling timer determines whether the accumulated timing signals exceed the voltage sampling interval ($T_{vs}$) 154. If not, the timer continues to accumulate time 156 until the voltage sampling interval has elapsed. When the voltage sampling interval has elapsed, the voltage sampling timer is reset for the next voltage sampling interval 158 and the voltage timing sampler signals the voltage sampling unit 48 to obtain a voltage sample. The voltage sample unit signals the multiplexer 44 which selects an appropriate one of the voltage sensors 160 and the voltage sampling unit samples the voltage 161 in the conductor monitored by the sensor currently connected to the voltage sampling unit. The voltage sample is stored 162 in the memory 36 of the data processing unit. Typically, the system connects and reads another voltage sensor at the next voltage sampling time; however, more than one sensor could be read each time voltage sampling signaled. The voltage is sampled at a rate that is sufficient to adequately describe the waveform of each AC voltage phase in the distribution panel. To avoid aliasing, the sampling rate for each phase of the electricity is typically at least twice the highest frequency anticipated for the line voltage but higher frequency sampling rates may be used to increase the number of available voltage samples or further define the voltage waveform.

The timing signals from the clock are also transmitted 156 to a current sampling timer 43. Like the voltage sampling timer, the current sampling timer accumulates timing signals 164 until the current sampling interval ($T_{IS}$) is attained 156. When the current sampling interval is reached, the current sampling timer resets 165 and transmits a signal to the current sampling unit 50. The current sampling unit signals the multiplexer 52 to connect an appropriate current transducer 166 and samples the output of the current transducer that is connected to the current sampling unit by the multiplexer 168. Typically, the system connects to and reads another current transformer at each occurrence of the sampling time, but more than one sensor could be read each time current sampling signaled. While the timing signals from a single clock synchronize the sampling times, the system could utilize separate clocks for each sampling unit and timing signals that are not synchronized.

An assumed current is determined by the data processing unit 170 from the rms current for a plurality of preceding samples, as disclosed by Bruno, U.S. Pat. No. 7,359,809, or from the instantaneous magnitude of the current sample or on some other basis. The data processing unit also looks up the ratio error appropriate for the current sensor when operated at the assumed current 174 and adjusts the magnitude of the instantaneous current of the current sample for ratio error 176.

A phase error interval reflecting the phase shift of the primary current relative to the secondary current produced by the phase error when the current transformer is operated with a current equal to the assumed current is determined 172. The appropriate phase error time interval may be selected from a table of time intervals versus current or computed with an equation expressing the phase error interval as a function of current for the particular current transformer or more than one transformer of a plurality of current transformers. Since the primary current and the voltage are in phase when generated, the phase of the secondary current is shifted relative to the voltage, as well as the primary current, by the magnetization of the transformer core. The data processing unit determines the magnitude of the voltage corresponding to the particular current sample taking into account the temporal offset of the phase error interval 178. The data processing unit may select a single voltage sample that was obtained from the bus bar connected to the load at a time nearest to the phase error adjusted sampling time for the instant current sample or may temporally interpolate between voltage samples that were obtained earlier and later than phase error adjusted sampling time or may use some other method for determining the appropriate value of the voltage. The power and other electrical parameters can be calculated from the current adjusted for ratio error and the voltage compensated for phase error 180.

Since the voltage is the same for all branch circuits connected to a single bus bar the voltage for a plurality of circuits connected to a bus bar can be measured with a single voltage transducer. On the other hand, a current transducer is required for each branch circuit conductor that is connected to the bus bar. As a result, if an identical sampling rate is appropriate to adequately describe the voltage and current waveforms, the current sampling interval it, typically, shorter than the voltage sampling interval to enable the greater number of current transducers to be sampled a sufficient number of times to adequately describe the waveform of the current. Due to the reduction in the number of voltage samples, the bandwidth and processing capacity of the branch circuit monitor's data processing unit can be substantially reduced compared to a monitor that obtains voltage and current samples in one-to-one correspondence even if the voltage is substantially oversampled, that is, sampled at a rate higher than required by to avoid aliasing.

The detailed description, above, sets forth numerous specific details to provide a thorough understanding of the present invention. However, those skilled in the art will appreciate that the present invention may be practiced without these specific details. In other instances, well known methods, procedures, components, and circuitry have not been described in detail to avoid obscuring the present invention.

All the references cited herein are incorporated by reference.

The terms and expressions that have been employed in the foregoing specification are used as terms of description and not of limitation, and there is no intention, in the use of such terms and expressions, of excluding equivalents of the features shown and described or portions thereof, it being recognized that the scope of the invention is defined and limited only by the claims that follow.

We claim:

1. A method of compensating for a phase error when measuring electricity, said method comprising using one or more processors to perform the steps of:
    (a) sampling an alternating current voltage at a voltage sampling time;
    (b) repeating step (a) at a voltage sampling rate;
    (c) at a current sampling time, sampling a current, said current sampling time temporally independent of said voltage sampling time; and
    (d) determining a phase error compensated voltage corresponding to said current sample, said phase error compensated voltage determined from at least one voltage sample obtained at a time increment offset by a phase error interval from said current sampling time, said phase error interval quantifying a temporal shift of said sampled current relative to said voltage, said temporal shift characteristic of a sensor used to obtain said current sample.

2. The method of compensating for a phase error of claim 1 wherein said step of sampling said current is repeated at a current sampling rate.

3. The method of compensating for a phase error of claim 2 wherein said sampling of said voltage at said voltage sampling rate and said sampling of said current at said current sampling rate are not interlocked.

4. The method of compensating for a phase error of claim 2 wherein said voltage sampling rate is different than said current sampling rate.

5. The method of compensating for a phase error of claim 1 wherein said sensor used to obtain said current sample comprises a current transformer.

6. The method of compensating for a phase error of claim 1 wherein the step of determining said phase error compensated voltage from at least one voltage sample obtained at a time increment offset by a phase error interval from said current sampling time comprises the steps of:
    (a) selecting a first voltage sample obtained at a first time, said first time temporally separated from said current sampling time by an interval greater than said phase error interval;
    (b) selecting a second voltage sample obtained at a second time, said second time temporally separated from said current sampling time by an interval less than said phase error interval; and
    (c) interpolating a magnitude of said first voltage sample and a magnitude of said second voltage sample.

7. The method of compensating for a phase error of claim 1 wherein the step of determining said phase error compensated voltage from at least one voltage sample obtained at a time increment offset by a phase error interval from said current sampling time comprises the step of selecting a voltage sample obtained at a time temporally separated from said current sampling time by an interval which is temporally nearest said phase error interval.

8. A method of measuring power of an alternating current, said method comprising using one or more processors to perform the steps of:
    (a) sampling a voltage of said alternating current at a voltage sampling time;
    (b) repeating step (a) at a voltage sampling rate;
    (c) at a current sampling time, sampling a secondary current induced in a current transformer by a primary current, said current sampling time temporally independent of said voltage sampling time;
    (d) repeating step (c) at a current sampling rate; and (e) computing a product of at least one sample of said current and a magnitude of a voltage sampled at a time temporally offset by a phase error interval from said current sampling time of said at least one sample of said current, said phase error interval quantifying a temporal shift of said secondary current relative to said primary current that is characteristic of said current transformer.

9. The method of measuring power of claim 8 wherein said voltage sampling rate is different than said current sampling rate.

10. The method of measuring power of claim 8 wherein at least one of said voltage sampling rate and said current sampling rate is a sampling rate selected to avoid aliasing of the respective one of said alternating current voltage and said current.

11. The method of measuring power of claim 8 wherein the step of computing a product of said sample of said current and a magnitude of a voltage sampled at a time temporally offset by a phase error interval from said current sampling time of said one sample of said current comprises the steps of:

(a) selecting a first voltage sample obtained at a first time, said first time temporally separated from said current sampling time by an interval greater than said phase error interval;
(b) selecting a second voltage sample obtained at a second time, said second time temporally separated from said current sampling time by an interval less than said phase error interval; and
(c) interpolating a magnitude of said first voltage sample and a magnitude of said second voltage sample.

12. The method of measuring power of claim 8 wherein the step of computing a product of said sample of said current and a magnitude of a voltage sampled at a time temporally offset by a phase error interval from said current sampling time of said one sample of said current comprises the step of selecting a voltage sample obtained at a time temporally separated from said current sampling time by an interval which is temporally nearest said phase error interval.

13. The method of measuring power of claim 8 further comprising the step of altering a magnitude of said current sample by a factor quantifying a ratio error characteristic of said current transformer.

14. A meter for measuring electricity, said meter comprising:
   (a) a voltage sensor;
   (b) a current transformer;
   (c) a non-transitory computer-readable medium or memory storing at least one current magnitude and a corresponding phase error interval characteristic of said current transformer, said phase error interval quantifying a temporal shift of said primary current relative to a secondary current induced in said current transformer when one of said primary current and said secondary current is of said current magnitude; and
   (d) a data processing system for executing at least one program instruction, said program instruction causing said data processing system to:
      (i) sample an alternating current voltage at said voltage sensor at a voltage sampling time;
      (ii) repeat step (d) (i) at a voltage sampling rate;
      (iii) at a current sampling time, sample a secondary current induced in said current sensor, said current sampling time temporally independent of said voltage sampling time;
      (iv) repeat step (d) (iii) at a current sampling rate; and
      (v) determine a product of at least one current sample and a voltage measured at a time offset by said phase error interval from said current sampling time.

15. The meter of claim 14 wherein said voltage sampling rate is not equal to said current sampling rate.

16. The meter of claim 14 wherein said data processing system further includes at least one programming instruction causing said data processing system to alter a magnitude of said current sample by a factor quantifying a ratio error characteristic of said current transformer.

17. The meter of claim 14 wherein said data processing system further includes at least one programming instruction causing said data processing system to:
   (a) select a first voltage sample obtained at a first time, said first time temporally separated from said current sampling time by an interval greater than said phase error interval;
   (b) select a second voltage sample obtained at a second time, said second time temporally separated from said current sampling time by an interval less than said phase error interval; and
   (c) determine said magnitude of said voltage measured at said time offset by said phase error interval from said current sampling time by interpolating of a magnitude of said first voltage sample and a magnitude of said second voltage sample.

18. The meter of claim 14 wherein said data processing system further includes at least one programming instruction causing said data processing system to select as said voltage measured at said time offset by said phase error interval from said current sampling time a voltage sample obtained at a time temporally separated from said current sampling time by an interval which is temporally nearest said phase error interval.

19. The meter of claim 14 further comprising a second current transformer for measuring a second current, said memory storing at least one current magnitude and a corresponding phase error interval characteristic of said second current transformer.

20. The meter of claim 19 wherein said one current magnitude and said corresponding phase error interval characteristic of said second current transformer is the same as said one current magnitude and said corresponding phase error interval characteristic of said current transformer.

* * * * *